United States Patent
Hu et al.

(10) Patent No.: US 10,923,080 B2
(45) Date of Patent: Feb. 16, 2021

(54) DETECTION SUBSTRATE, DISPLAY PANEL AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Weipin Hu, Beijing (CN); Qianqian Bu, Beijing (CN); Zhonglan Zhao, Beijing (CN); Hui Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/699,439

(22) Filed: Nov. 29, 2019

(65) Prior Publication Data
US 2020/0312273 A1 Oct. 1, 2020

(30) Foreign Application Priority Data
Mar. 25, 2019 (CN) .......................... 2019 1 0228161

(51) Int. Cl.
*G09G 5/10* (2006.01)
*G06K 9/00* (2006.01)
*G09G 3/3275* (2016.01)
*H01L 27/32* (2006.01)

(52) U.S. Cl.
CPC ........... *G09G 5/10* (2013.01); *G06K 9/00046* (2013.01); *G09G 3/3275* (2013.01); *H01L 27/3234* (2013.01); *G09G 2320/0626* (2013.01)

(58) Field of Classification Search
CPC ...... G09G 5/10; G06K 9/0046; G06K 9/0002; G06K 9/00013
USPC .................................. 345/690–691; 382/124
See application file for complete search history.

(56) References Cited

U.S. PATENT DOCUMENTS

| | | | | |
|---|---|---|---|---|
| 5,781,651 | A * | 7/1998 | Hsiao | G07C 9/37 382/127 |
| 8,866,347 | B2 * | 10/2014 | Benkley, III | G06K 9/00053 307/116 |
| 2017/0083749 | A1 * | 3/2017 | Lin | G06K 9/00013 |
| 2017/0110059 | A1 * | 4/2017 | Sung | G09G 3/3275 |
| 2017/0289805 | A1 * | 10/2017 | Hong | H04W 12/08 |
| 2019/0334128 | A1 * | 10/2019 | Kim | G02B 1/118 |

* cited by examiner

*Primary Examiner* — Calvin C Ma
(74) *Attorney, Agent, or Firm* — Nath, Goldberg & Meyer; Joshua B. Goldberg (57) ABSTRACT

A detection substrate, a display panel and a display apparatus are provided in the disclosure. The detection substrate includes a first substrate and at least one device pair for fingerprint identification-brightness detection on the first substrate. Each of the at least one device pair for fingerprint identification-brightness detection includes a fingerprint identification device, an insulating layer and a brightness detection device which are sequentially stacked on the first base.

20 Claims, 5 Drawing Sheets

DETECTION SUBSTRATE, DISPLAY PANEL AND DISPLAY APPARATUS

CROSS-REFERENCE TO RELATED APPLICATIONS

The present application claims the priority of Chinese Patent Application No. 201910228161.9, entitled "detection substrate, display panel, method and apparatus for brightness compensation, and display apparatus", filed on Mar. 20, 2019, in the Chinese Intellectual Property Office, the disclosure of which is incorporated herein in its entirety by reference.

TECHNICAL FIELD

The disclosure relates to the field of display technology, and in particular, to a detection substrate, a display panel and a display apparatus.

BACKGROUND

An Organic Light Emitting Diode display panel, which is also referred as an OLED display panel, emits Light by recombination of electrons and holes in an organic functional layer.

SUMMARY

In one aspect, a detection substrate is provided. The detection substrate includes a first base and at least one device pair for fingerprint identification-brightness detection on the first base, and each of the at least one device pair for fingerprint identification-brightness detection includes a fingerprint identification device, an insulating layer and a brightness detection device which are sequentially stacked on the first base.

In some embodiments, the fingerprint identification device includes a PN junction, and the brightness detection device includes a PN junction.

In some embodiments, the fingerprint identification device includes a PIN junction, and the brightness detection device includes a PIN junction.

In some embodiments, one of the fingerprint identification device and the brightness detection device includes a PN junction, and the other one of the fingerprint identification device and the brightness detection device includes a PIN junction.

In some embodiments, the fingerprint identification device further includes a first connection electrode adjacent to the insulating layer, the brightness detection device further includes a second connection electrode adjacent to the insulating layer, the insulating layer is between the first connection electrode and the second connection electrode, the first connection electrode is electrically coupled to the PIN junction of the fingerprint identification device, the second connection electrode is electrically coupled to the PIN junction of the brightness detection device, and at least one of the first connection electrode, the insulating layer, and the second connection electrode is opaque to light.

In some embodiments, the insulating layer is opaque to light.

In some embodiments, the detection substrate further includes a plurality of gate lines and a plurality of data lines intersecting with the plurality of gate lines, and the at least one device pair for fingerprint identification-brightness detection includes a plurality of device pairs for fingerprint identification-brightness detection, and a first and second transistors are provided corresponding to each of the plurality of device pairs for fingerprint identification-brightness detection, and the plurality of device pairs for fingerprint identification-brightness detection are respectively provided in a plurality of intersection regions formed by the plurality of gate lines and the plurality of data lines, and are arranged in an array, and each of the plurality of data lines includes a first sub data line and a second sub data line in parallel with the first sub data line, and the device pairs for fingerprint identification-brightness detection in a same row correspond to a same gate line, the device pairs for fingerprint identification-brightness detection in a same column correspond to a same data line, each of the first transistors corresponding to the device pairs for fingerprint identification-brightness detection in the same row has a gate coupled to the corresponding gate line, and a source and a drain respectively coupled to the corresponding first sub data line and the first connecting electrode electrically coupled to the corresponding fingerprint identification device, each of the second transistors corresponding to the device pairs for fingerprint identification-brightness detection in the same row has a gate coupled to the corresponding gate line, and a source and a drain respectively coupled to the corresponding second sub data line and the second connecting electrode electrically coupled to the corresponding brightness detection device.

In some embodiments, the detection substrate further includes a plurality of gate lines and a plurality of data lines intersecting with the plurality of gate lines, and the at least one device pair for fingerprint identification-brightness detection includes a plurality of device pairs for fingerprint identification-brightness detection, and a first and second transistors are provided corresponding to each of the plurality of device pairs for fingerprint identification-brightness detection, and the plurality of device pairs for fingerprint identification-brightness detection are respectively provided in a plurality of intersection regions formed by the plurality of gate lines and the plurality of data lines, and are arranged in an array, each of the plurality of gate lines includes a first sub gate line and a second sub gate line in parallel with the first sub gate line, and each of the plurality of data lines includes a first sub data line and a second sub data line in parallel with the first sub data line, and the device pairs for fingerprint identification-brightness detection in a same row correspond to a same gate line, the device pairs for fingerprint identification-brightness detection in a same column correspond to a same data line, each of the first transistors corresponding to the device pairs for fingerprint identification-brightness detection in the same row has a gate coupled to the corresponding first sub gate line, and a source and a drain respectively coupled to the corresponding first sub data line and the first connecting electrode electrically coupled to the corresponding fingerprint identification device, each of the second transistors corresponding to the device pairs for fingerprint identification-brightness detection in the same row has a gate coupled to the corresponding second sub gate line, and a source and a drain respectively coupled to the corresponding second sub data line and the second connecting electrode electrically coupled to the corresponding brightness detection device.

In another aspect, a display panel is provided. The display panel includes a display substrate and the detection substrate of claim 1, wherein the display substrate is on a side of the brightness detection device distal to the first base, and a light-outgoing side of the display substrate is towards the detection substrate, wherein the display substrate is an organic light emitting diode display substrate and includes a second base, a first electrode on the second base, an organic functional layer on a side of the first electrode distal to the second base, and a second electrode on a side of the organic functional layer distal to the second base.

In some embodiments, the first electrode is a light-transmissive electrode, the second electrode is a light-reflective electrode, a surface of the brightness detection device, distal to the first base, of the detection substrate is towards a surface of the second base distal to the first electrode, the brightness detection device is configured to detect brightness of light transmitted from the first electrode, and the fingerprint identification device is configured to detect brightness of light which is transmitted from the first electrode and emitted to the fingerprint identification device after being reflected by a fingerprint.

In some embodiments, the display panel further includes a circular polarizer between the second base and the brightness detection device.

In some embodiments, the circular polarizer includes a quarter-wave plate and a linear polarizer sequentially stacked on a side of the second base distal to the first electrode.

In some embodiments, the display panel further includes a driving circuit on a side of the second base adjacent to the first electrode, and a buffer layer on the driving circuit and on a part of the second base which is not provided with the driving circuit, wherein an orthographic projection of the device pairs for fingerprint identification-brightness detection on the second base is within an orthographic projection of the driving circuit on the second base, and the first electrode is provided on the buffer layer and electrically coupled to the driving circuit through an via hole in the buffer layer.

In some embodiments, the second base includes a light exiting region and a non-light exiting region, and the orthographic projection of the driving circuit on the second base is located in the non-light exiting region.

In still another aspect, a display apparatus including the display panel is provided, and the display apparatus further includes a detection circuit, wherein the detection circuit is electrically coupled to the plurality of data lines and the plurality of the gate lines on the detection substrate, and is configured to acquire optical signals detected by the brightness detection device and/or the fingerprint identification device, so as to generate a brightness compensation signal based on the optical signal detected by the brightness detection device and a target brightness, and/or to generate a fingerprint identification signal based on the optical signal detected by the fingerprint identification device.

DETAILED DESCRIPTION

The present disclosure will now be described in detail below with reference to accompanying drawings and embodiments to enable those skilled in the art to better understand the solution of the present disclosure.

Figure 1:
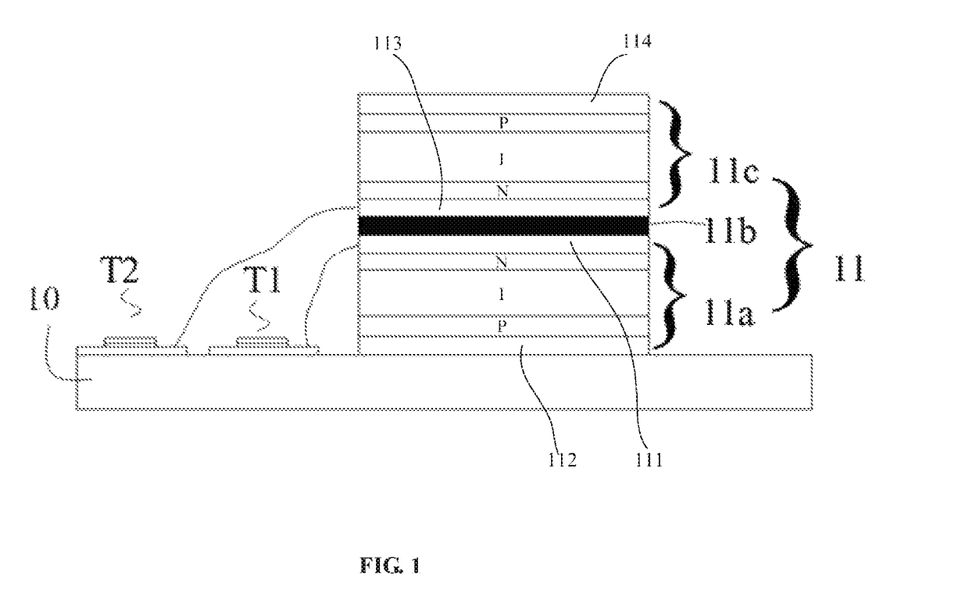
FIG. 1 is a schematic diagram of a structure of a detection substrate according to an embodiment of the present disclosure.
Figure 2:
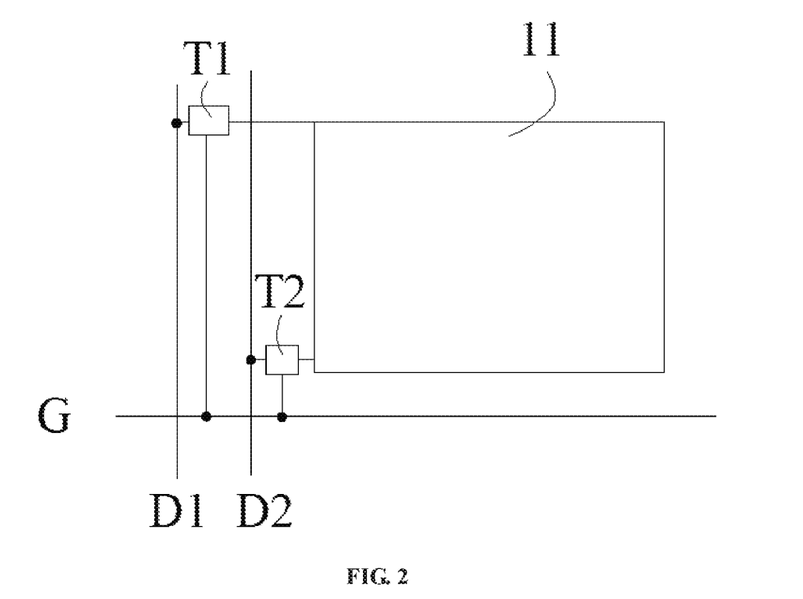
FIG. 2 is a circuit diagram of a detection substrate according to an embodiment of the present disclosure.

According to an embodiment of the present disclosure, a detection substrate is provided. Referring to FIGS. 1 and 2, the detection substrate includes a first base 10 and at least one device pair for fingerprint identification-brightness detection 11 provided on the first base 10. Each of the at least one device pair for fingerprint identification-brightness detection 11 includes a fingerprint identification device 11a, an insulating layer 11b, and a brightness detection device 11c, which are sequentially stacked on the base 10 in a direction distal to the first base 10.

The fingerprint identification device 11a in the device pair for fingerprint identification-brightness detection 11 is used to detect light reflected by a fingerprint to identify the fingerprint. The brightness detection device 11c of the device pair for fingerprint identification-brightness detection 11 is used to detect light emitted from a light emitting structure (e.g., an OLED display panel) to compensate the light emitted from the light emitting structure. The insulating layer 11b between the fingerprint identification device 11a and the brightness detection device 11c may prevent the two from interfering with each other.

Figure 9:
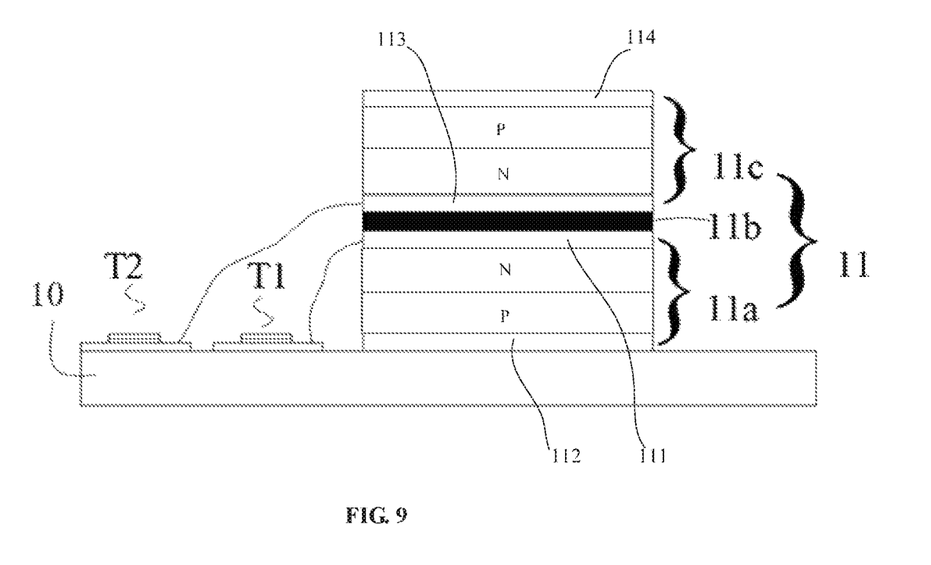
FIG. 9 is a schematic diagram of a structure of a detection substrate according to an embodiment of the present disclosure.
Figure 10:
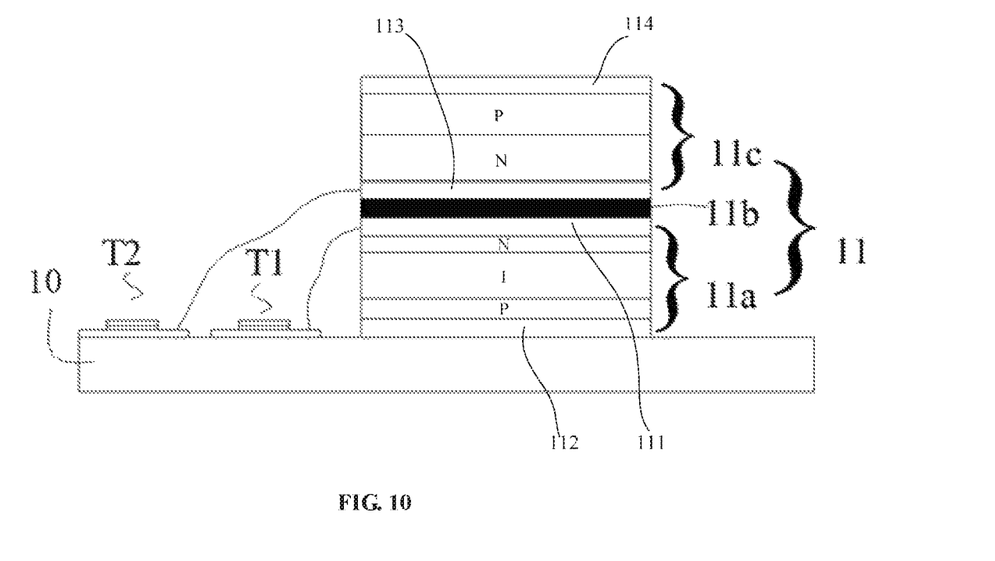
FIG. 10 is a schematic diagram of a structure of a detection substrate according to an embodiment of the present disclosure.

In some embodiments, the fingerprint identification device 11a includes a PN junction and the brightness detection device 11c includes a PN junction, as shown in FIG. 9; or alternatively, the fingerprint identification device 11a includes a PIN junction and the brightness detection device 11a includes a PIN junction, as shown in FIG. 1; or alternatively, one of the fingerprint identification device 11a and the brightness detection device 11c, and the other one of the two includes a PIN junction, as shown in FIG. 10. Semiconductors of P-type and N-type are fabricated on a same semiconductor (usually silicon or germanium) chip by diffusion, and a space charge region formed at their interface is referred as a PN junction. A PIN junction is formed by sandwiching an intrinsic semiconductor layer I between the P-type semiconductor and the N-type semiconductor. The PN junction and the PIN junction as a photoelectric conversion structure may be used to convert light received into electricity, thereby detecting the light irradiated thereon. A detection substrate is shown in FIG. 1, and the fingerprint identification device 11a and the brightness detection device 11c therein each have a PIN junction, where a P region, an I region and an N region in the fingerprint identification device 11a and the brightness detection device 11c are represented by P, I and N, respectively. The following description will be given by taking a PIN junction as an example.

Figure 3:
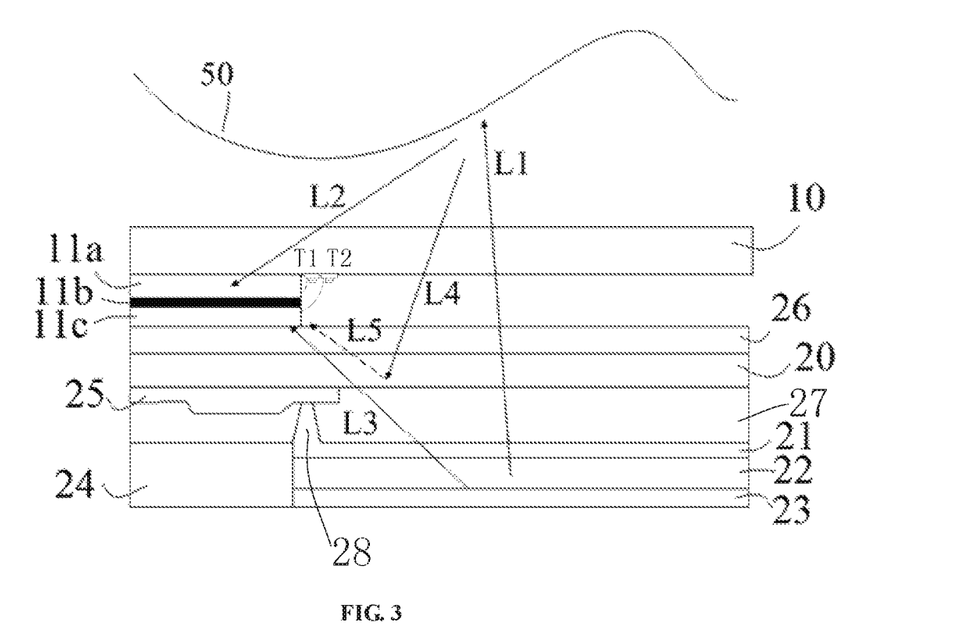
FIG. 3 is a schematic diagram of a structure of a display panel according to an embodiment of the present disclosure.

FIG. 3 shows an embodiment of the detection substrate applied in a display panel. The device pair for fingerprint identification-brightness detection 11 is towards the OLED display substrate actively emitting light. The brightness detection device 11c closest to the display substrate may be used to detect the brightness of the display panel in a local region (a light ray L3 labeled in FIG. 3). The fingerprint identification device 11a of the device pair for fingerprint identification-brightness detection 11, which is relatively distant from the display substrate, is used to detect the intensity of light (a light ray L2 labeled in FIG. 3) reflected by the fingerprint 50 from the light (a light ray L1 labeled in FIG. 3) emitted from the display panel. The intensity of the light reflected back is not same for peaks and ridges of the fingerprint 50, from which a shape of the fingerprint 50 may be calculated.

In some embodiments, as shown in FIG. 1, the fingerprint identification device 11a further includes a first connection electrode 111 adjacent to the insulating layer 11b, the brightness detection device 11c further includes a second connection electrode 113 adjacent to the insulating layer 11b. The insulating layer 11b is located between the first connection electrode 111 and the second connection electrode 113. The first connection electrode 111 is electrically coupled to the PIN junction of the fingerprint identification device 11a, and the second connection electrode 113 is electrically coupled to the PIN junction of the brightness detection device 11c. At least one of the first connection electrode 111, the insulating layer 11b, and the second connection electrode 113 is opaque to light.

At least one of the first connection electrode 111, the insulating layer 11b, and the second connection electrode 113 is opaque to light, such that the fingerprint identification device 11a receives only light reflected back from the fingerprint 50 without being affected by light detected by the brightness detection device 11c; and the brightness detection device 11c receives only the light emitted from the display substrate without being affected by the light reflected back by the fingerprint 50 and directed towards the brightness detection device 11c. Generally, an electrode 112 of the fingerprint identification device 11a matching the first connection electrode 111 is further provided between the first base 10 and the PIN junction of the fingerprint identification device 11a, and an electrode 114 of the brightness detection device 11c matching the second connection electrode 113 is further provided between the second base 20 and the PIN junction of the brightness detection device 11c.

Since the fingerprint identification device 11a includes a PN junction or a PIN junction and the brightness detection device 11c includes a PN junction or a PIN junction, that is, the fingerprint identification device 11a may be a photodiode, and the brightness detection device 11c may also be a photodiode. Alternatively, the fingerprint identification device 11a may be a diode, and the brightness detection device 11c may also be a diode. Corresponding anodes and cathodes provided for these PN and PIN junctions may be provided in a conventional manner.

In some embodiments, the insulating layer 11b is opaque to light. The insulating layer 11b is, for example, a black insulating layer 11b. The first connection electrode 111, adjacent to the insulating layer 11b, of the fingerprint identification device 11a or the second connection electrode 113, adjacent to the insulating layer 11b, of the brightness detection device 11c may be opaque to light, so that the fingerprint identification device 11a and the brightness detection device 11c do not interference with each other.

In some embodiments, as shown in FIG. 2, the detection substrate further includes a plurality of gate lines G and a plurality of data lines intersecting with the plurality of gate lines G, and the at least one device pair for fingerprint identification-brightness detection includes a plurality of device pairs for fingerprint identification-brightness detection. Each of the plurality of device pairs for fingerprint identification-brightness detection 11 is further provided with a first transistor T1 and a second transistor T2. The plurality of device pairs for fingerprint identification-brightness detection 11 are respectively provided in a plurality of intersection regions formed by the plurality of gate lines and the plurality of data lines, and are arranged in an array. Each of the plurality of data lines includes a first sub data line D1 and a second sub data line D2 in parallel with the first sub data line D1. The device pairs for fingerprint identification-brightness detection 11 in a same row correspond to a same gate line G. The device pairs for the fingerprint identification-brightness detection 11 in a same column correspond to a same data line. Each of the first transistors T1 corresponding to the device pairs for fingerprint identification-brightness detection 11 in the same row has a gate coupled to the corresponding gate line G, and a source and a drain respectively coupled to the corresponding first sub data line D1 and the first connecting electrode 111 electrically coupled to the corresponding fingerprint identification device 11a. Each of the second transistors T2 corresponding to the device pairs for fingerprint identification-brightness detection 11 in the same row has a gate coupled to the corresponding gate line G, and a source and a drain respectively coupled to the corresponding second sub data line D2 and the second connecting electrode 113 electrically coupled to the corresponding brightness detection device 11c.

In this way, when an effective voltage is applied to the gate line G to turn on the first transistor T1 and the second transistor T2 simultaneously, the electrical signal generated by the fingerprint identification device 11l a and the brightness detection device 11c can be read out by a detection circuit cooperating with the detection substrate through the corresponding first sub data line D1 and the corresponding second sub data line D2.

It is noted that, the fingerprint identification is required to be relatively high, and separate fingerprint identification devices 11a may be further provided in the detection substrate besides the device pairs for fingerprint identification-brightness detection 11. The separate fingerprint identification devices 11a may be provided as in related art, and therefore, the detailed description thereof is omitted.

Figure 6:
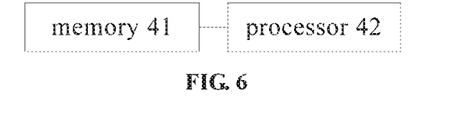
FIG. 6 is a block diagram of a brightness compensation apparatus according to an embodiment of the present disclosure.
Figure 7:
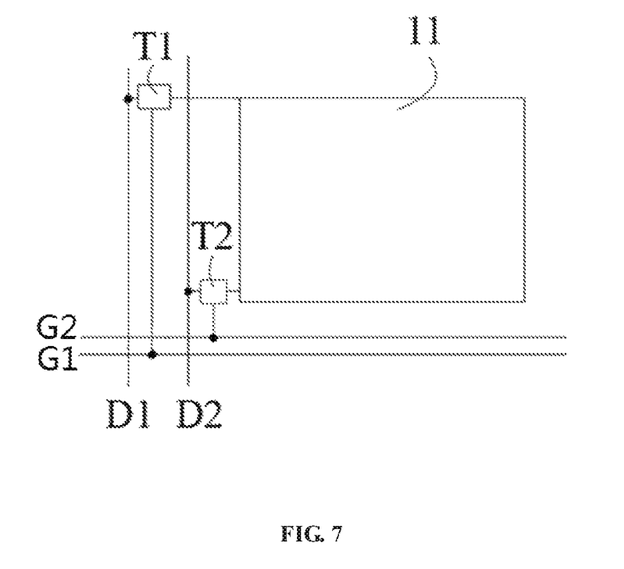
FIG. 7 is a circuit diagram of a detection substrate according to an embodiment of the present disclosure.

The threshold voltages of the first transistor T1 and the second transistor T2 may be set to be equal, which may result in an easy control of the turn-on voltage by each of the gate lines G. The first transistor T1 and the second transistor T2 may operate independently of each other, and in this case, two sub-gate lines may be provided to control the first transistor T1 and the second transistor T2, respectively. As shown in FIG. 7, each of the plurality of gate lines may be provided to include a first sub-gate line G1 and a second sub-gate line G2 in parallel with the first sub-gate line G1. Each of the first transistors T1 corresponding to the device pairs for fingerprint identification-brightness detection 11 in the same row has a gate coupled to the corresponding first sub gate line G1, and each of the second transistors T2 corresponding to the device pairs for fingerprint identification-brightness detection 11 in the same row are has a gate coupled to the corresponding second sub gate line G2. The other structures of the embodiment shown in FIG. 7 are the same as those of FIG. 6, and therefore, the detailed description thereof is omitted.

The operations of the fingerprint identification device 11a and the brightness detection device 11c are independent from each other, so that fingerprint identification and brightness detection based on the detection substrate may or may not be performed at a same time.

The gate lines G (each including the first and second sub-gate lines G1 and G2) in the detection substrate are provided on the first base 10. The gate lines G are different from those in a conventional display substrate. The gate lines in a display substrate are used for turning on transistors on the display substrate for display. If the detection substrate and the display substrate are used in conjunction with each other, the timing control for the gate lines in the display substrate should ensure that brightness of pixels at corresponding positions in the display substrate is stable when the signals of the gate lines G in the detection substrate are valid.

According to an embodiment of the present disclosure, a display panel including the display substrate and the detection substrate described above is provided. As shown in FIG. 3, the display substrate is located on a side of the brightness detecting device 11c distal to the first base 10, and a light outgoing direction from the display substrate is towards the detection substrate. It is noted that, the detection substrate may be used in combination with a top-emission OLED display substrate, a bottom-emission OLED display substrate, or any other type of display substrate (e.g., a liquid crystal display substrate, an inorganic micro-light emitting diode display substrate, etc.). Therefore, the display panel is provided with three functions of display, brightness detection and fingerprint identification. Since the fingerprint identification device 11a and the brightness detection device 11l c are integrated in the detection substrate, the thickness of the display panel is reduced compared with those in which brightness detection function and the fingerprint identification function are integrated in the display panel.

In some embodiments, the display substrate is an organic light emitting diode display substrate, and the display substrate includes a second base 20, a first electrode 21 provided on the second base 20, an organic functional layer 22 provided on a side of the first electrode 21 distal to the second base 20, and a second electrode 23 provided on a side of the organic functional layer 22 distal to the second base 20. The detection substrate in the above embodiments, whether is a type of top emission or a type of bottom emission, may be used in combination with the display substrate In some embodiments, as shown in FIG. 3, the first electrode 21 is a light-transmissive electrode, and the second electrode 23 is a light-reflective electrode. A surface of the brightness detection device 11c, distal to the first base 10, of the detection substrate is towards a surface of the second base 20 distal to the first electrode 21. The brightness detection device 11c is used for detecting brightness of light transmitted from the first electrode 21, and the fingerprint identification device 11a is used for detecting brightness of light which is transmitted from the first electrode 21 and emitted to the fingerprint identification device 11a after being reflected by the fingerprint 50. A pixel definition layer 24 is also shown in FIG. 3 to separate sub-pixels.

In an embodiment, the display substrate is a bottom-emission OLED display substrate. Light emitted from the organic light emitting diode is irradiated towards the fingerprint 50 and the brightness detection device 11c in a direction in which the first electrode 21 is directed towards the second base 20. Since flatness of a bottom surface of the second base 20 is superior to that of a top surface of the display substrate, the combination between the detection substrate and the bottom surface of the second base 20 of the display substrate is more stable.

In some embodiments, as shown in FIG. 3, the display panel further includes a circular polarizer 26 between the second base 20 and the brightness detection device 11c for preventing light reflected by the fingerprint from entering the brightness detection device 11c after being reflected by the second base 20.

Figure 8:
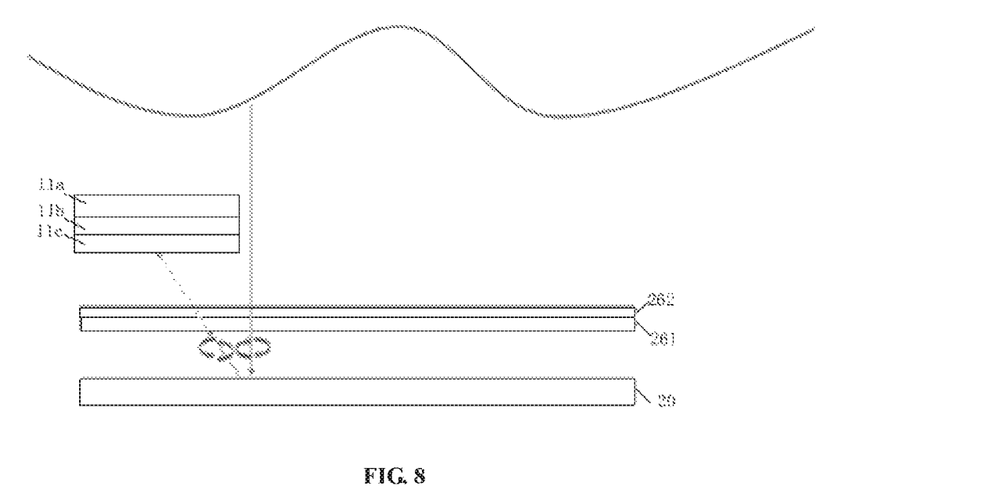
FIG. 8 is a schematic diagram of an anti-interference optical path according to an embodiment of the present disclosure.

In an embodiment, as shown in FIG. 8, the circular polarizer 26 includes a quarter-wave plate 261 and a linear polarizer 262 sequentially stacked on a side of the second base 20 distal to the first electrode 21. The linear polarizer 262 is used to convert natural light into linearly polarized light. When light (a light ray L4 labeled in FIG. 3) reflected by the fingerprint 50 passes through the quarter-wave plate 261 of the circular polarizer 26, for example, the light is converted into right-handed circularly polarized light, and then is converted into left-handed circularly polarized light after being reflected by the second base 20, and thus is blocked by the quarter-wave plate 261 of the circular polarizer 26. Therefore, the light reflected by the fingerprint 50 does not interfere with the brightness detection device 11c.

In some embodiments, as shown in FIG. 3, the display panel further includes a driving circuit 25 on a side of the second base 20 adjacent to the first electrode 21, and a buffer layer 27 covering the driving circuit 25 and the exposed second base 20. An orthographic projection of the device pairs for fingerprint identification-brightness detection 11 on the second base 20 is located in an orthographic projection of the driving circuit 25 on the second base 20, so that the aperture ratio of the display panel may not be influenced. The first electrode 21 is provided on the buffer layer 27 and electrically coupled to the driving circuit 25 through a via hole 28. The driving circuit 25 is used to drive the organic light emitting diode, constituted by the first electrode 21, the organic functional layer 22 and the second electrode 23, to emit light.

In some embodiments, the second base 20 is divided into a light-exiting region and a non-light-exiting region, and an orthographic projection of the brightness detection device 11c and the fingerprint identification device 11a on the second base 20 is located in the non-light-exiting region. Meanwhile, an orthographic projection of the driving circuit 25 on the second base 20 is also located in the non-light-exiting region.

Since positions of the fingerprint identification device 11a and the brightness detection device 11c correspond to the non-light-emitting region of the display panel, the brightness detection device 11c and the fingerprint identification device 11a do not affect the aperture ratio of the display substrate. Specifically, in FIG. 3, the brightness detection device 11c and the fingerprint identification device 11a may be provided at positions on the first base 10 corresponding to the driving circuit 25 (which is opaque to light).

Figure 4:
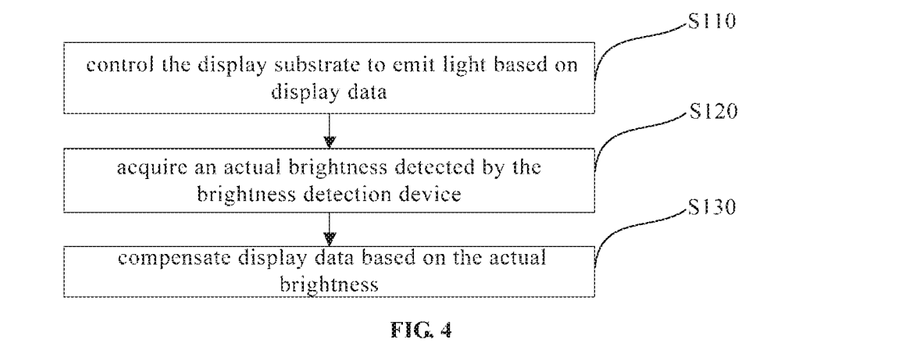
FIG. 4 is a flowchart of a method for brightness compensation according to an embodiment of the disclosure.

According to an embodiment of the present disclosure, a method for compensating brightness of a display panel is provided to perform brightness compensation for the display panel in the above embodiments. As shown in FIG. 4, the method for compensating brightness includes the following steps.

In step S110, the display substrate is controlled to emit light based on display data.

In step S120, an actual brightness detected by the brightness detection device 11c is acquired.

In step S130, the display data is compensated based on the actual brightness.

There is a certain mapping relationship between the brightness corresponding to the display data and the actual brightness detected by the brightness detecting device 11c.

If the actual brightness is low, gray scale of the display data is increased in the subsequent display. If the actual brightness is high, gray scale of the display data is reduced in the subsequent display. Since the actual brightness is obtained in real time, the compensation for the brightness may also be performed in real time.

Figure 5:
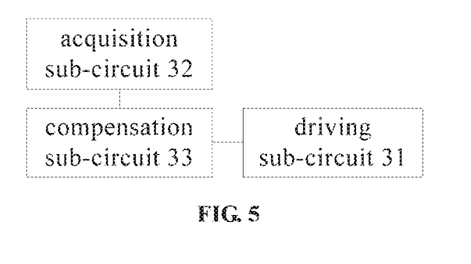
FIG. 5 is a block diagram of a brightness compensation apparatus according to an embodiment of the present disclosure.

According to an embodiment of the present disclosure, a brightness compensation apparatus for a display panel is provided for compensating the brightness of the display panel in the above embodiments. As shown in FIG. 5S, the brightness compensation apparatus includes: a driving sub-circuit 31 for controlling the display substrate to emit light based on display data; an acquisition sub-circuit 32 for acquiring actual brightness detected by the brightness detection device 11c; and a compensation sub-circuit 33 for compensating the display data based on the actual brightness.

The driving sub-circuit 31 includes, for example, a digital-to-analog conversion circuit for converting digital display data into analog driving voltage to drive the corresponding organic light emitting diode to emit light. The acquisition sub-circuit 32 includes, for example, an analog-to-digital conversion circuit and a communication circuit, for converting current signals detected by the brightness detection device 11c into digital values and sending the digital values to the compensation sub-circuit 33. The compensation sub-circuit 33 includes, for example, a calculation circuit, for determining a rule for correcting the display data based on the display data and the brightness data. Subsequent display is carried out according to the rule.

According to an embodiment of the present disclosure, a brightness compensation apparatus for a display panel is provided for compensating brightness of the display panel in the above embodiments. As shown in FIG. 6, the brightness compensation apparatus includes a memory 41 and a processor 42. The memory 41 stores instructions that are executed by the processor 42 to perform the brightness compensation method in the above described embodiments.

Specifically, the memory 41 may include a read only memory 41 (ROM), a random access memory 41 (RAM), and the like, and the processor 42 is, for example, a central processing unit 42 (CPU), a programmable logic device (FPGA), and the like.

According to an embodiment of the disclosure, a display apparatus including the display panel in the above embodiments is provided, and the display apparatus further includes a detection circuit. The detection circuit may include a circuit corresponding to the brightness compensation apparatus in the above embodiment. The detection circuit is electrically coupled to the plurality of data lines and the plurality of gate lines on the detection substrate, respectively, and is configured to acquire optical signals detected by the brightness detection device 11c and/or the fingerprint identification device 11a, so as to generate a brightness compensation signal based on the optical signals detected by the brightness detection device 11c and a target brightness, and/or generate a fingerprint identification signal based on the optical signals detected by the fingerprint identification device 11a.

Specifically, the display apparatus may be any product or component with a display function, such as a liquid crystal display module, an OLED display module, a micro-light emitting diode display module, a mobile phone, a tablet computer, a television, a display, a notebook computer, a digital photo frame, a navigator and the like.

It is to be understood that the above embodiments are merely exemplary embodiments that are employed to illustrate the principles of the present disclosure, and the present disclosure is not limited thereto. It will be apparent to those skilled in the art that various changes and modifications can be made therein without departing from the spirit and scope of the disclosure, and these are to be considered as the scope of the disclosure.

What is claimed is:

1. A detection substrate, comprising a first base and at least one device pair for fingerprint identification-brightness detection on the first base,
    wherein each of the at least one device pair for fingerprint identification-brightness detection comprises a fingerprint identification device, an insulating layer and a brightness detection device which are sequentially stacked on the first base; and
    wherein the fingerprint identification device comprises a first stack structure and is configured to identify a fingerprint on a side of the fingerprint identification device distal to the brightness detection device, and the brightness detection device comprises a second stack structure and is configured to detect light from a side of the brightness detection device distal to the fingerprint identification device, and the first stack structure and the second stack structure are arranged on both sides of the insulation layer in a direction perpendicular to the first base, respectively.

2. The detection substrate of claim 1, wherein the fingerprint identification device comprises a PN junction, and the brightness detection device comprises a PN junction.

3. The detection substrate of claim 1, wherein the fingerprint identification device comprises a PIN junction, and the brightness detection device comprises a PIN junction.

4. The detection substrate of claim 1, wherein one of the fingerprint identification device and the brightness detection device comprises a PN junction, and the other one of the fingerprint identification device and the brightness detection device comprises a PIN junction.

5. The detection substrate of claim 3, wherein the fingerprint identification device further comprises a first connection electrode adjacent to the insulating layer, the brightness detection device further comprises a second connection electrode adjacent to the insulating layer, the insulating layer is between the first connection electrode and the second connection electrode, the first connection electrode is electrically coupled to the PIN junction of the fingerprint identification device, the second connection electrode is electrically coupled to the PIN junction of the brightness detection device, and at least one of the first connection electrode, the insulating layer, and the second connection electrode is opaque to light.

6. The detection substrate of claim 5, wherein the insulating layer is opaque to light.

7. The detection substrate of claim 6, further comprising a plurality of gate lines and a plurality of data lines intersecting with the plurality of gate lines, and the at least one device pair for fingerprint identification-brightness detection comprises a plurality of device pairs for fingerprint identification-brightness detection,
    wherein a first and second transistors are provided corresponding to each of the plurality of device pairs for fingerprint identification-brightness detection,
    wherein the plurality of device pairs for fingerprint identification-brightness detection are respectively provided in a plurality of intersection regions formed by the plurality of gate lines and the plurality of data lines, and are arranged in an array, and each of the plurality of data lines comprises a first sub data line and a second sub data line in parallel with the first sub data line, wherein the device pairs for fingerprint identification-brightness detection in a same row correspond to a same gate line, the device pairs for fingerprint identification-brightness detection in a same column correspond to a same data line, each of the first transistors corresponding to the device pairs for fingerprint identification-brightness detection in the same row has a gate coupled to the corresponding gate line, and a source and a drain respectively coupled to the corresponding first sub data line and the first connecting electrode electrically coupled to the corresponding fingerprint identification device, each of the second transistors corresponding to the device pairs for fingerprint identification-brightness detection in the same row has a gate coupled to the corresponding gate line, and a source and a drain respectively coupled to the corresponding second sub data line and the second connecting electrode electrically coupled to the corresponding brightness detection device.

8. The detection substrate of claim 6, further comprising a plurality of gate lines and a plurality of data lines intersecting with the plurality of gate lines, and the at least one device pair for fingerprint identification-brightness detection comprises a plurality of device pairs for fingerprint identification-brightness detection, wherein a first and second transistors are provided corresponding to each of the plurality of device pairs for fingerprint identification-brightness detection, wherein the plurality of device pairs for fingerprint identification-brightness detection are respectively provided in a plurality of intersection regions formed by the plurality of gate lines and the plurality of data lines, and are arranged in an array, each of the plurality of gate lines comprises a first sub gate line and a second sub gate line in parallel with the first sub gate line, and each of the plurality of data lines comprises a first sub data line and a second sub data line in parallel with the first sub data line, wherein the device pairs for fingerprint identification-brightness detection in a same row correspond to a same gate line, the device pairs for fingerprint identification-brightness detection in a same column correspond to a same data line, each of the first transistors corresponding to the device pairs for fingerprint identification-brightness detection in the same row has a gate coupled to the corresponding first sub gate line, and a source and a drain respectively coupled to the corresponding first sub data line and the first connecting electrode electrically coupled to the corresponding fingerprint identification device, each of the second transistors corresponding to the device pairs for fingerprint identification-brightness detection in the same row has a gate coupled to the corresponding second sub gate line, and a source and a drain respectively coupled to the corresponding second sub data line and the second connecting electrode electrically coupled to the corresponding brightness detection device.

9. A display apparatus comprising the display panel of claim 8, and a detection circuit, wherein the detection circuit is electrically coupled to the plurality of data lines and the plurality of the gate lines on the detection substrate, and is configured to acquire optical signals detected by the brightness detection device and/or the fingerprint identification device, so as to generate a brightness compensation signal based on the optical signal detected by the brightness detection device and a target brightness, and/or to generate a fingerprint identification signal based on the optical signal detected by the fingerprint identification device.

10. A display panel, comprising a display substrate and the detection substrate of claim 1, wherein the display substrate is on a side of the brightness detection device distal to the first base, and a light outgoing side of the display substrate is towards the detection substrate, wherein the display substrate is an organic light emitting diode display substrate and comprises a second base, a first electrode on the second base, an organic functional layer on a side of the first electrode distal to the second base, and a second electrode on a side of the organic functional layer distal to the second base.

11. The display panel of claim 10, wherein the first electrode is a light-transmissive electrode, the second electrode is a light-reflective electrode, a surface of the brightness detection device, distal to the first base, of the detection substrate is towards a surface of the second base distal to the first electrode, the brightness detection device is configured to detect brightness of light transmitted from the first electrode, and the fingerprint identification device is configured to detect brightness of light which is transmitted from the first electrode and emitted to the fingerprint identification device after being reflected by a fingerprint.

12. The display panel of claim 11, further comprising a circular polarizer between the second base and the brightness detection device.

13. The display panel of claim 12, wherein the circular polarizer comprises a quarter-wave plate and a linear polarizer sequentially stacked on a side of the second base distal to the first electrode.

14. The display panel of claim 13, further comprising a driving circuit on a side of the second base adjacent to the first electrode, and a buffer layer on the driving circuit and on a part of the second base which is not provided with the driving circuit, wherein an orthographic projection of the device pairs for fingerprint identification-brightness detection on the second base is within an orthographic projection of the driving circuit on the second base, and the first electrode is provided on the buffer layer and electrically coupled to the driving circuit through an via hole in the buffer layer.

15. The display panel of claim 14, wherein the second base comprises a light exiting region and a non-light exiting region, and the orthographic projection of the driving circuit on the second base is within the non-light exiting region.

16. The display panel of claim 15, wherein the fingerprint identification device comprises a PIN junction, and the brightness detection device comprises a PIN junction.

17. The display panel of claim 16, wherein the fingerprint identification device further comprises a first connection electrode adjacent to the insulating layer, the brightness detection device further comprises a second connection electrode adjacent to the insulating layer, the insulating layer is between the first connection electrode and the second connection electrode, the first connection electrode is electrically coupled to the PIN junction of the fingerprint identification device, the second connection electrode is electrically coupled to the PIN junction of the brightness detection device, and at least one of the first connection electrode, the insulating layer, and the second connection electrode is opaque to light.

18. The display panel of claim 17, wherein the insulating layer is opaque to light.

19. The display panel of claim 18, wherein the detection substrate further comprises a plurality of gate lines and a plurality of data lines intersecting with the plurality of gate lines, and the at least one device pair for fingerprint identification-brightness detection comprises a plurality of device pairs for fingerprint identification-brightness detection,
- wherein a first and second transistors are provided corresponding to each of the plurality of device pairs for fingerprint identification-brightness detection,
- wherein the plurality of device pairs for fingerprint identification-brightness detection are respectively provided in a plurality of intersection regions formed by the plurality of gate lines and the plurality of data lines, and are arranged in an array, and each of the plurality of data lines comprises a first sub data line and a second sub data line in parallel with the first sub data line,
- wherein the device pairs for fingerprint identification-brightness detection in a same row correspond to a same gate line, the device pairs for fingerprint identification-brightness detection in a same column correspond to a same data line,
- each of the first transistors corresponding to the device pairs for fingerprint identification-brightness detection in the same row has a gate coupled to the corresponding gate line, and a source and a drain respectively coupled to the corresponding first sub data line and the first connecting electrode electrically coupled to the corresponding fingerprint identification device,
- each of the second transistors corresponding to the device pairs for fingerprint identification-brightness detection in the same row has a gate coupled to the corresponding gate line, and a source and a drain respectively coupled to the corresponding second sub data line and the second connecting electrode electrically coupled to the corresponding brightness detection device.

20. The display panel of claim 18, wherein the detection substrate further comprises a plurality of gate lines and a plurality of data lines intersecting with the plurality of gate lines, and the at least one device pair for fingerprint identification-brightness detection comprises a plurality of device pairs for fingerprint identification-brightness detection,
- wherein a first and second transistors are provided corresponding to each of the plurality of device pairs for fingerprint identification-brightness detection,
- wherein the plurality of device pairs for fingerprint identification-brightness detection are respectively provided in a plurality of intersection regions formed by the plurality of gate lines and the plurality of data lines, and are arranged in an array, each of the plurality of gate lines comprises a first sub gate line and a second sub gate line in parallel with the first sub gate line, and each of the plurality of data lines comprises a first sub data line and a second sub data line in parallel with the first sub data line,
- wherein the device pairs for fingerprint identification-brightness detection in a same row correspond to a same gate line, the device pairs for fingerprint identification-brightness detection in a same column correspond to a same data line,
- each of the first transistors corresponding to the device pairs for fingerprint identification-brightness detection in the same row has a gate coupled to the corresponding first sub gate line, and a source and a drain respectively coupled to the corresponding first sub data line and the first connecting electrode electrically coupled to the corresponding fingerprint identification device,
- each of the second transistors corresponding to the device pairs for fingerprint identification-brightness detection in the same row has a gate coupled to the corresponding second sub gate line, and a source and a drain respectively coupled to the corresponding second sub data line and the second connecting electrode electrically coupled to the corresponding brightness detection device.

\* \* \* \* \*